(12) United States Patent
You et al.

(10) Patent No.: US 7,190,197 B1
(45) Date of Patent: Mar. 13, 2007

(54) CLOCK PHASE DETECTOR FOR NOISE MANAGEMENT

(75) Inventors: Zhong You, Austin, TX (US); Trenton John Grale, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 10 days.

(21) Appl. No.: 10/949,970

(22) Filed: Sep. 24, 2004

(51) Int. Cl.
*H03L 7/00* (2006.01)

(52) U.S. Cl. ............ 327/144; 327/141; 327/147; 327/156; 327/291

(58) Field of Classification Search ......... 327/99, 327/144, 152, 163, 407, 408, 409, 410, 411
See application file for complete search history.

(56) References Cited

U.S. PATENT DOCUMENTS

| | | | |
|---|---|---|---|
| 5,659,261 A * | 8/1997 | Bacrania et al. ......... 327/112 |
| 5,799,048 A * | 8/1998 | Farjad-Rad et al. ...... 375/360 |
| 6,404,248 B1 * | 6/2002 | Yoneda ..................... 327/158 |
| 6,472,913 B2 * | 10/2002 | Natsume ................... 327/144 |
| 6,535,045 B1 * | 3/2003 | Vangal ...................... 327/333 |
| 6,667,704 B1 * | 12/2003 | Grale et al. ............... 341/123 |
| 6,876,239 B2 * | 4/2005 | Bell ........................... 327/158 |

* cited by examiner

*Primary Examiner*—Quan Tra
*Assistant Examiner*—Khareem E. Almo
(74) *Attorney, Agent, or Firm*—Thompson & Knight LLP; James J. Murphy

(57) ABSTRACT

Clock signal control circuitry including a selector for selecting between a first clock signal and an inverse of the first clock signal and a phase detector for determining a phase relationship between the first clock signal and the second clock signal and in response causing the selector to select between the first clock signal and the inverse of the first clock signal.

20 Claims, 11 Drawing Sheets

CLOCK PHASE DETECTOR FOR NOISE MANAGEMENT

FIELD OF INVENTION

The present invention relates in general to mixed analog-digital circuit techniques, and in particular, to clock management circuits and methods for reducing noise in mixed-signal systems.

BACKGROUND OF INVENTION

Many audio applications, such as audio analog to digital converters (ADCs) and audio encoder-decoders (CODECs), utilize a serial data port to transmit digitized audio data to other devices in a system. A typical serial data port outputs bits of a serial audio data (SDATA) stream on the selected edges of an associated serial clock (SCLK) signal. In a stereo system, two channels of audio data are time-multiplexed onto the SDATA stream with a left-right clock (LRCK) signal. A master clock (MCLK) signal, which is typically received from an external source, is divided-down to generate internal MCLK signals, which time the operations of the various internal circuits. Advantageously, the utilization of serial ports minimizes the number of pins and associated on-chip driver circuitry.

A typical serial data port can operate in either a master mode or a slave mode. In the master mode, the SCLK and LRCK clock signals are generated internally, in response to the received MCLK signal, and output to the destination of the SDATA stream. In the slave (asynchronous) mode, the SCLK and LRCK clock signals are received from the destination of the SDATA stream.

In an ADC operating in the slave mode, the analog input signal is typically sampled on the rising edge of an internal MCLK signal, which may have an arbitrary phase relationship with the SCLK signal. If the digital data at the SDATA output transitions after the analog data has been sampled at the analog inputs, no noise problems typically result. However, if the digital output data transitions slightly before the analog data has been sampled, then noise can couple into other circuitry on-chip, particularly the analog circuitry, thereby degrading the quality of the output signal. This problem is particularly acute when an ADC is operating in response to an SCLK signal frequency which is close to, or the same as, the frequency of the internal MCLK signal. In this case, every falling edge of SCLK may cause a noisy transition at the SDATA output just prior to analog sampling at the next rising edge of the MCLK signal.

Typical serial audio systems have utilized retiming circuits to delay or otherwise retime SCLK signal such that the digital data transitions at the SDATA output occur after the critical sampling edges of the associated MCLK signal. However, this technique has not performed well, especially when the frequency of the SCLK signal approaches that of the MCLK signal. In particular, as the frequency of the SCLK signal approaches the frequency of the MCLK signal, the timing window within which the SCLK signal can be retimed becomes small. If SCLK signal, and hence the data at the SDATA out, is delayed beyond this timing window, a setup time violation may occur at the destination device, resulting in the reception of incorrect data.

Consequently, new techniques are required for reducing noise at the serial output of and ADC operating in the slave mode. Such techniques should be particularly applicable to ADCs in which the SCLK signal frequency approaches the frequency of the associated MCLK signal.

SUMMARY OF INVENTION

The principles of the present invention are embodied in circuits and methods for clock signal management, which assist in the minimization of on-chip noise in mixed-signal integrated circuits. According to one representative embodiment, clock signal control circuitry is disclosed which includes a selector for selecting between a first clock signal and an inverse of the first clock signal. A phase detector determines a phase relationship between the first clock signal and the second clock signal and in response causes the selector to select between the first clock signal and the inverse of the first clock signal.

Embodiments of the present principles are particularly advantageous an an input signal is sampled with a clock signal and the resulting output signal is output from an output driver with another clock signal. Advantageously, these principles ensure that the sampling and output operations are sufficiently spaced in time to minimize sampling of noise generated by the output driver. The inventive concepts are particularly advantageous when applied to audio integrated circuits operating in a slave mode, in which a master clock signal sampling the input stream and a serial clock signal driving the output stream are received from an external device with an arbitrary phase relationship. For example, when analog audio input data is sampled on the rising edges of the master clock signal and digital data are output on the falling edges of the serial clock signal, embodiments of the inventive concepts ensure that the falling edges of the serial clock signal and the rising edge of the master clock signal are spaced in time such that noise coupling from the digital output driver to the analog input circuitry is minimized.

BRIEF DESCRIPTION OF DRAWINGS

For a more complete understanding of the present invention, and the advantages thereof, reference is now made to the following descriptions taken in conjunction with the accompanying drawings, in which.

DETAILED DESCRIPTION OF THE INVENTION

The principles of the present invention and their advantages are best understood by referring to the illustrated embodiment depicted in FIGS. 1–9 of the drawings, in which like numbers designate like.

Figure 1:
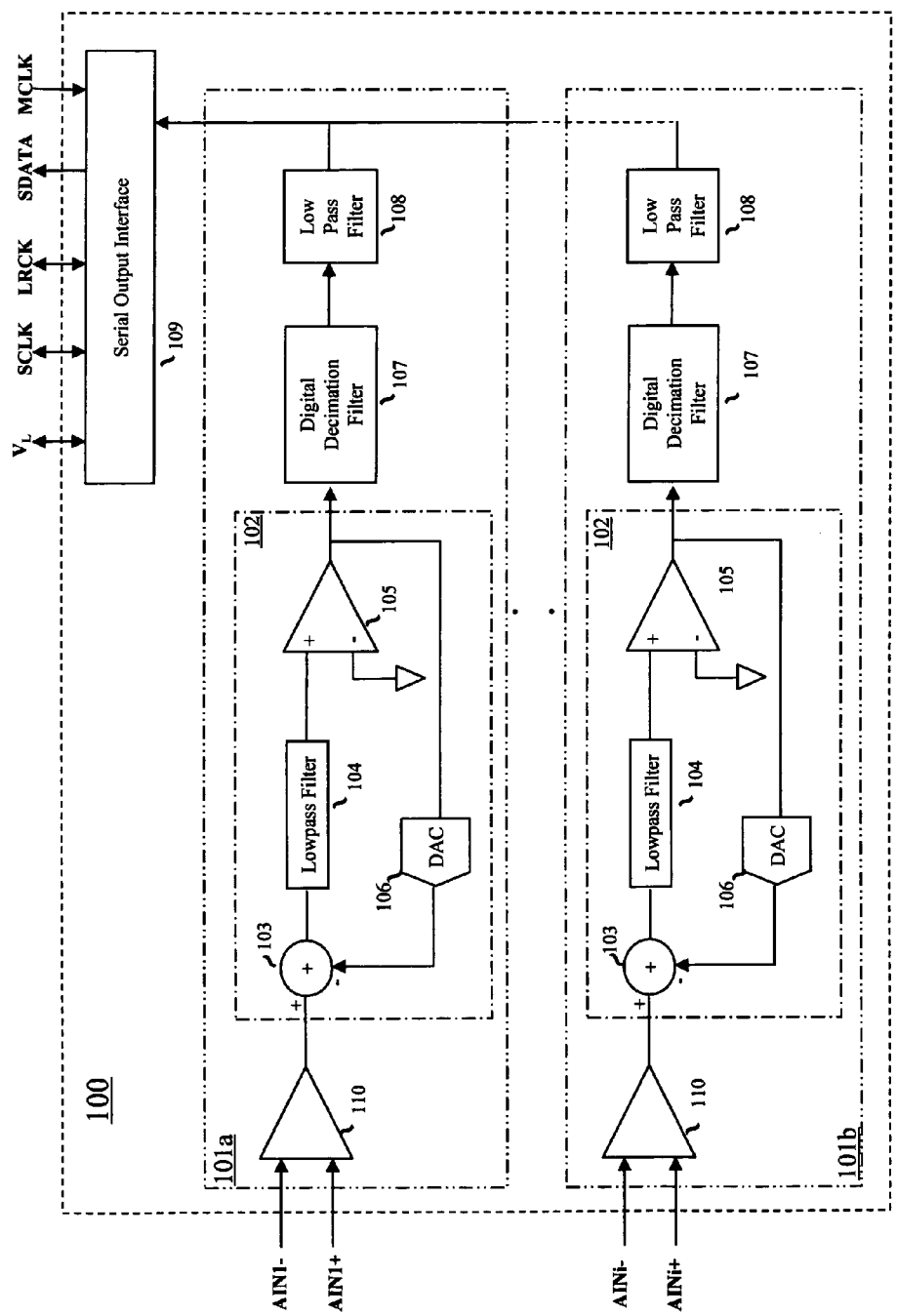
FIG. 1 is a high level block diagram of a single-chip audio analog-to-digital converter (ADC) suitable for demonstrating the principles of the present invention.

FIG. 1 is a high level functional block diagram of a single-chip audio analog-to-digital converter (ADC) 100 suitable for describing the principles of the present invention. ADC 100 is only one of a number of possible applications in which the principles can advantageously be utilized. Other examples include general purpose ADCs, digital to analog converters (DACs), and encoder-decoders (Codecs).

ADC 100 includes n-number of conversion paths, two of which, 101a and 101b, are shown for reference, for converting n-number of channels of analog audio data respectively received at left and right analog differential inputs AINi+/−, where i is the channel number from 1 to n. The analog inputs for each channel are passed through an input gain stage 110 and then to a delta-sigma modulator 102.

Each delta-sigma modulator 102 is represented in FIG. 1A by a summer 102, low-pass filter 104, comparator (quantizer) 105 and a DAC 106 in the feedback loop. The outputs from the delta-sigma modulators are passed through a decimation filter 107, which reduces the sample rate, and a high pass filter 108.

The resulting digital audio data are output through a single serial port SDATA of serial output interface 109, timed with a serial clock (SCLK) signal and a left-right clock (LRCK) signal. In the slave mode, the SCLK and LRCK signals are generated externally and input to converter 100, along with the MCLK signal. In the master mode, the SCLK and LRCK signals generated on-chip, along with the associated data, in response to a received master clock MCLK.

Figure 2:
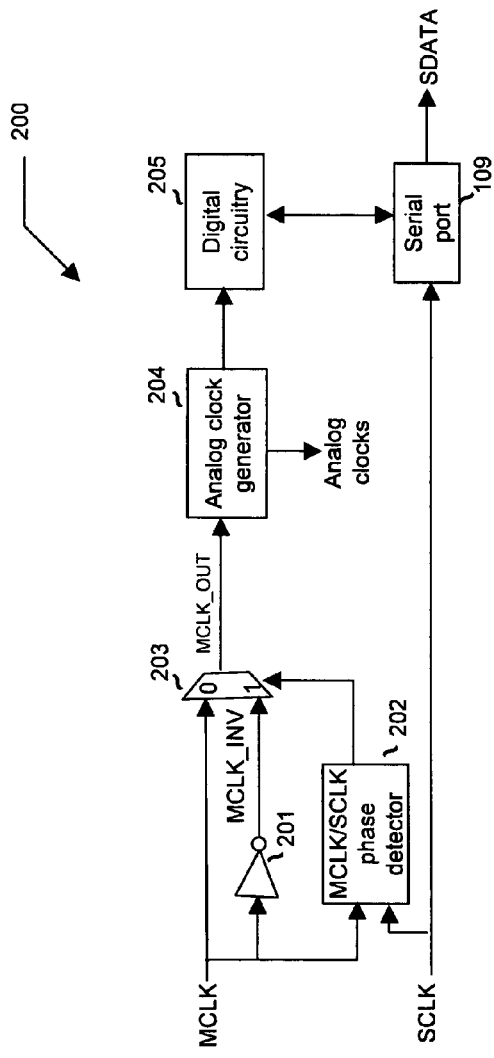
FIG. 2 is a high level block diagram of serial port timing circuitry including a clock phase inverter circuit embodying the principles of the present invention and suitable for controlling the phase relationship between the serial clock (SCLK) and master clock (MCLK) signals shown in FIG. 1.

FIG. 2 is a high level block diagram of serial port timing circuitry 200, according to one embodiment of the inventive principles. Serial port timing circuitry 200 includes an inverter 201 which generates the inverted MCLK signal, MCLK_INV, an MCLK/SCLK phase detector 202, and a multiplexer 203. Generally, MCLK/SCLK phase detector 202 and multiplexer 203 select either the received MCLK signal or the MCLK_INV signal as an MCLK_OUT signal which provides a sufficient time window between analog sampling and transitions of the SDATA output signal. In particular, when the SCLK and MCLK signals are within a window around zero (0) degrees out-of-phase, the non-inverted MCLK signal is selected as the MCLK_OUT signal. Otherwise, when the SCLK and MCLK signals are within a complementary window around one hundred and eighty (180) degrees out-of-phase, the MCLK_INV signal is selected as the MCLK_OUT signal. The MCLK_OUT signal is then presented to analog clock generator 204 to generate the corresponding analog clocks driving the analog circuitry of ADC 100 shown in FIG. 1, as well as passed to the digital circuitry 205 of ADC 100, to time operations in the digital domain.

Figure 3:
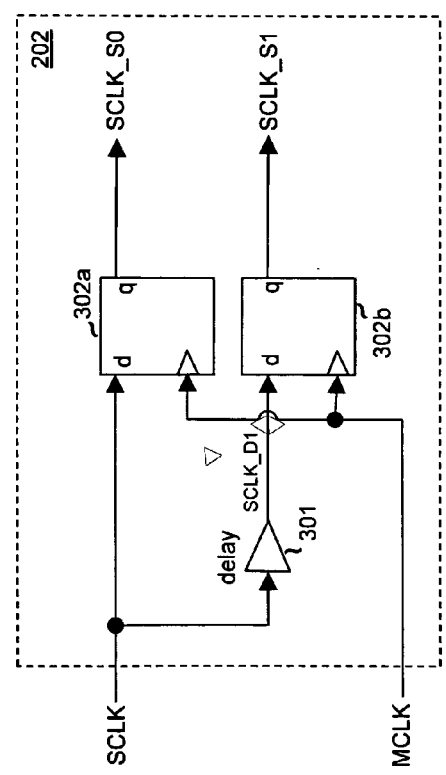
FIG. 3 is a block diagram of one exemplary implementation of the MCLK/SCLK phase detector shown in FIG. 2.

One exemplary implementation of MCLK/SCLK phase detector 202 is shown in further detail in FIG. 3. In this embodiment, the true (un-delayed) SCLK signal is sampled in a first D flip-flop 302a as the signal SCLK_s0. A delayed version of the SCLK signal, SCLK_D1, is generated by a delay circuit 301 and sampled onto a second D flip-flop 302b as the SCLK_s1 signal. The delay introduced by delay circuitry 301 one sets the window between the edges of the SCLK and MCLK signals in which the MCLK signal must be inverted. Specifically, if the SCLK signal phase relationship with the MCLK signal is close to either zero (0) or one hundred and eighty (180) degrees, then MCLK/SCLK phase detector 202 detects either rising or falling edges of the SCLK signal, respectively. Otherwise, MCLK/SCLK phase detector 202 detects either the high phase or the low phase of the SCLK signal.

The operation of the embodiment of MCLK/SCLK phase detector 202 shown in FIG. 2 is illustrated in the timing diagrams of FIGS. 4A–4F. For discussion purposes, analog data is being sampled in ADC 100 of FIG. 1 on the rising edges of the MCLK_OUT signal and noise is being generated at the SDATA output on the falling edges of the SCLK signal, although the present inventive principles are not limited to these conditions. For example, in alternate embodiments, input data may be sampled on the on falling edges of the MCLK_OUT signal and/or output data output on the rising edges of the SCLK signal.

Figure 4A:
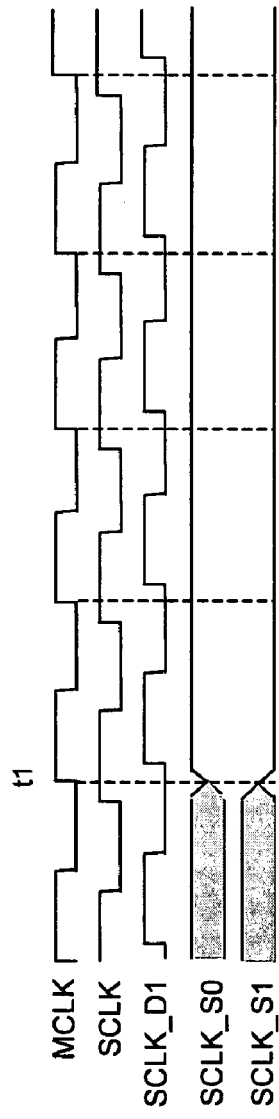
FIGS. 4A–4C illustrate representative phase relationships between the MCLK and SCLK signals in which the MCLK signal is not inverted by the clock phase inverter circuit FIG. 2.
Figure 4B:
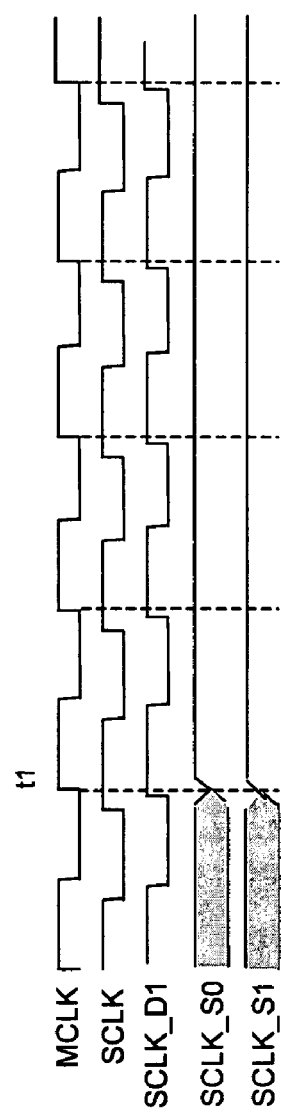
Figure 4C:
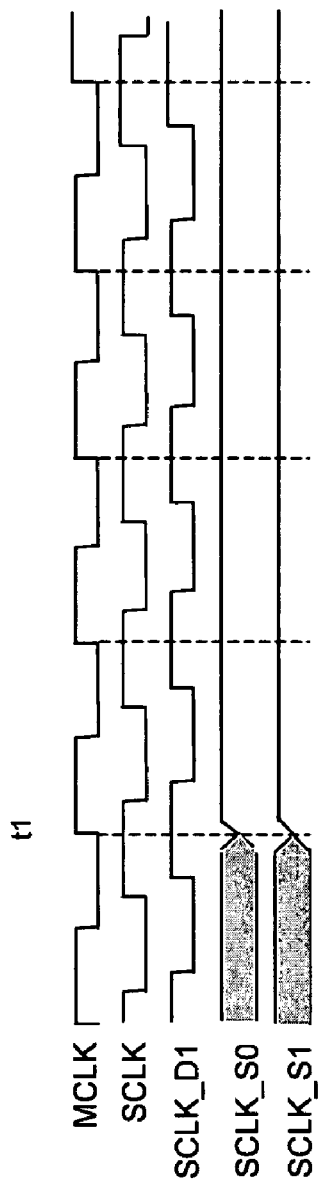

FIGS. 4A–4C illustrate the phase relationships between the MCLK signal and the SCLK in which true (un-inverted) MCLK signal is selected by MCLK/SCLK phase detector 202 and multiplexer 203 of FIG. 2. Generally, in each of these cases, the rising edges of the SCLK signal occur before the next rising edge of the MCLK signal.

In FIG. 4A, the rising edge of FIG. 3 of the SCLK signal is detected. For example, prior to time t1, the SCLK_s0 and SCLK_s1 signals at the outputs of D flip-flops 302a and 302b of FIG. 3 are both in a don't care state. Before the rising edge of the MCLK signal at time t1, the SCLK signal transitions to a logic high state, while the SCLK_D1 signal remains in a logic low state. In this case, after the rising edge of the MCLK signal, the SCLK_s0 signal is in a logic high state and the SCLK_s1 signal is in logic low state (i.e. together representing a logic 10), and multiplexer 203 of FIG. 2 passes the true (non-inverted) MCLK signal.

FIGS. 4B and 4C illustrate two cases in which the high phase of the SCLK signal is detected. In the example of FIG. 4B, the SCLK signal is in a logic high state, and the SCLK_D1 signal has just transitioned to a logic high state, when the next rising edge of the MCLK signal occurs at time t1. As a result, both the SCLK_s0 and SCLK_s1 signals at the outputs of flip-flops 302a and 302b of FIG. 3 transition to the logic high state with the rising edge of the MCLK signal (i.e. together representing a logic 11). For these states of the SCLK_s0 and SCLK_s1 SIGNALS, multiplexer 203 of FIG. 2 again passes the true MCLK signal as the MCLK_OUT signal for driving analog clock generator 204. The example shown in FIG. 4C is similar to that of FIG. 4B, with the exception that the SCLK and SCLK_D1 signals transition to the logic high state well before the arrival of the next rising edge of the MCLK signal.

Figure 4D:
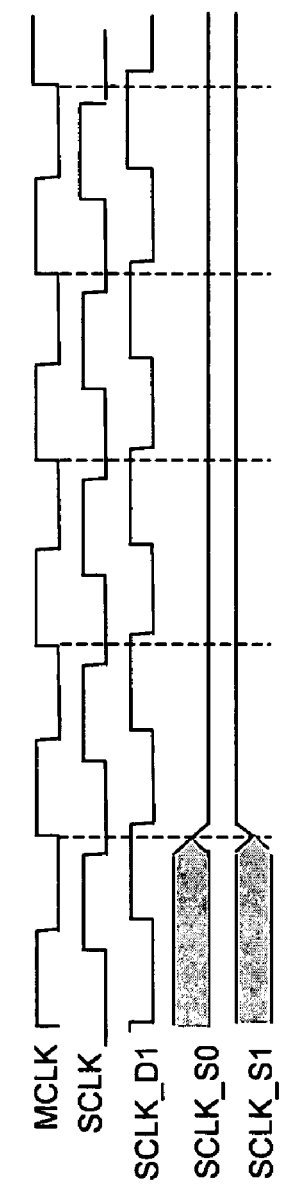
FIGS. 4D–4F illustrate representative phase relationships between the MCLK and SCLK signals in which the MCLK signal is inverted by the clock phase inverter circuit FIG. 2.
Figure 4E:
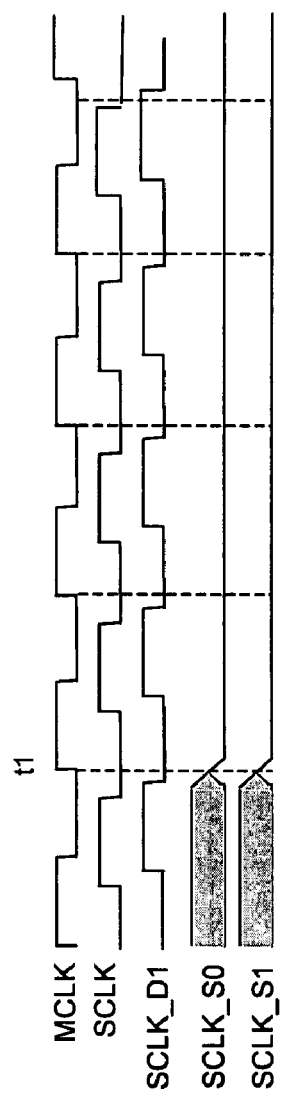
Figure 4F:
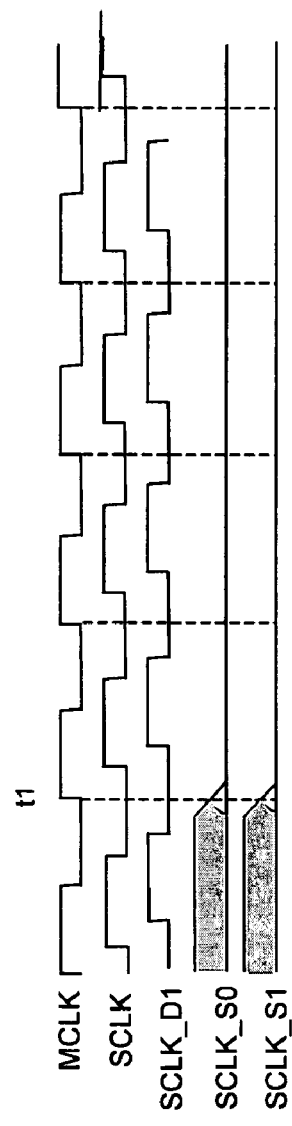

FIGS. 4D–4F are timing diagrams illustrating exemplary phase relationships between the MCLK and SCLK signals under which the MCLK_INV signal is selected by multiplexer 203 of FIG. 2 as the MCLK_OUT signal. In particular, FIG. 4C depicts the detection of the falling edges of the SCLK signal, and FIGS. 4E and 4F depict the detection of the low phases of the SCLK signal.

As shown in FIG. 4D, at time t1, the SCLK signal has already transitioned to a logic low level, while the SCLK_D1 signal is still in the logic high state with the rising edge of the MCLK signal. Consequently, the SCLK_S0 and SCLK_S1 signals are respectively set to logic low and logic high states by D flip-flops 302a and 302b of FIG. 3, thereby together representing a logic 01. For a logic 01 state, multiplexer 203 of FIG. 2 selects the MCLK_INV signal generated by inverter 201 as the MCLK_OUT signal for driving analog clock generator 204.

In both the close low phase detection case of FIG. 4E and the low phase detection case of FIG. 4F, the SCLK and SCLK_D1 signals both transition to the logic low state prior to the arrival of the next rising edge of the MCLK signal at time t1. In these examples, flip-flops 302a and 302b of FIG. 3 output SCLK_S0 and SCLK_S1 signals both in the logic low state (i.e. a logic 00). For these conditions, multiplexer 203 of FIG. 2 also selects the inverted MCLK signal generated by inverter 201 as the MCLK_OUT signal.

Figure 5:
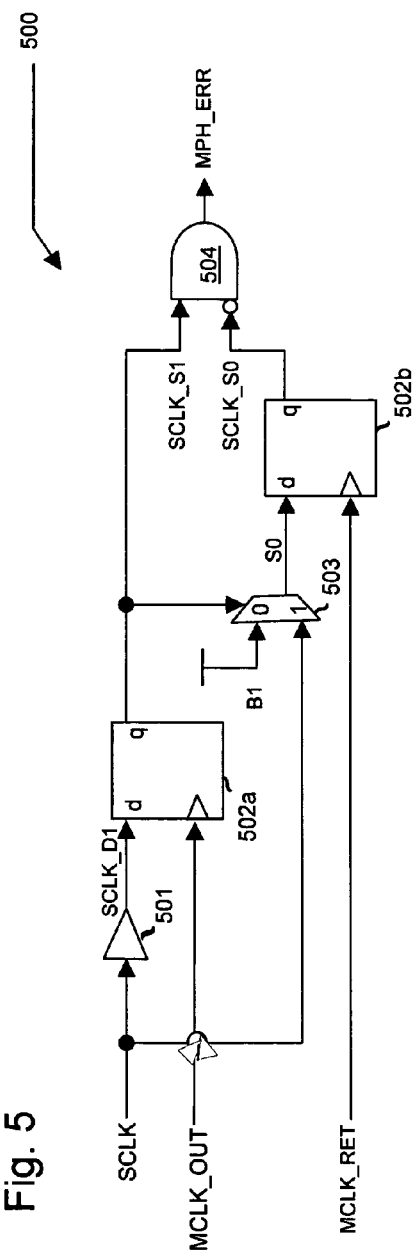
FIG. 5 is a block diagram of an alternate MCLK/SCLK phase detector embodying the principles of the present invention.

An exemplary alternate MCLK/SCLK phase detector 500 for controlling the selection of the MCLK_OUT signal by multiplexer 203 of FIG. 2 is shown in the block diagram of FIG. 5. In the illustrated embodiment, the MCLK_OUT signal selected by multiplexer 203 is fed-back to the input of alternate MCLK/SCLK phase detector 500, as the MCLK signal, and is inverted by inverter 201 to become the MCLK_INV signal.

In MCLK/SCLK phase detector 500, a delay 501 generates the delayed SCLK signal, SCLK_D1, which is sampled in a first D flip-flop 502a on rising edges of the MCLK_OUT signal to generate the intermediate signal SCLK_S1. A second D flip-flop 502b samples either the un-delayed SCLK signal or a logic 1 blocking signal (B1), as selected by multiplexer 503, on the rising edges of the MCLK_RET signal. Specifically, if the intermediate SCLK_S1 signal is in a logic low state, multiplexer 503 selects the B1 blocking signal, otherwise multiplexer 503 selects the un-delayed SCLK signal. An output gate 504 generates the output signal MCLK_ERR from the SCLK_S0 signal sampled onto second D flip-flop 502b or the SCLK_S1 SIGNAL output from first flip-flop 502a.

Figure 6A:
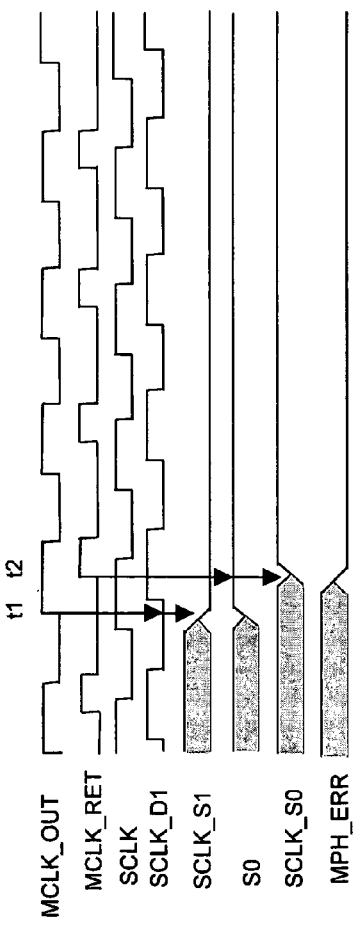
FIGS. 6A–6C illustrate exemplary phase relationships between the MCLK and SCLK signals in which the MCLK signal is not inverted by the alternate MCLK/SCLK phase detector of FIG. 5.
Figure 6B:
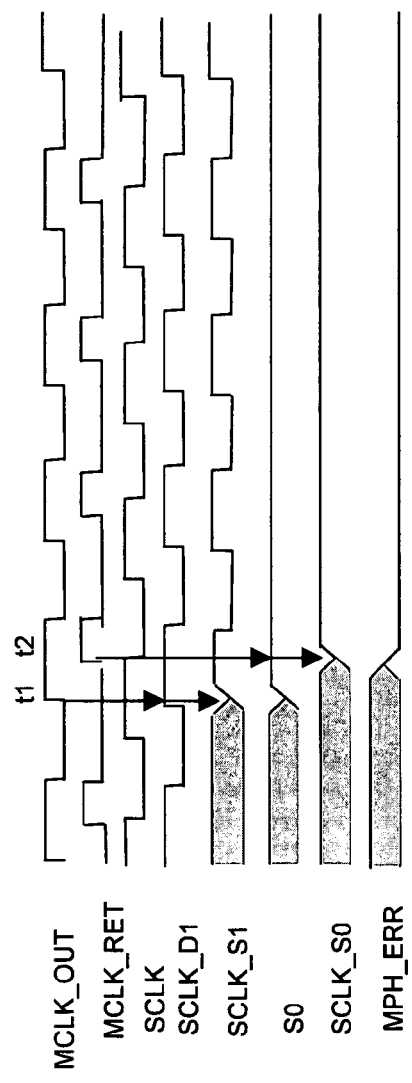
Figure 6D:
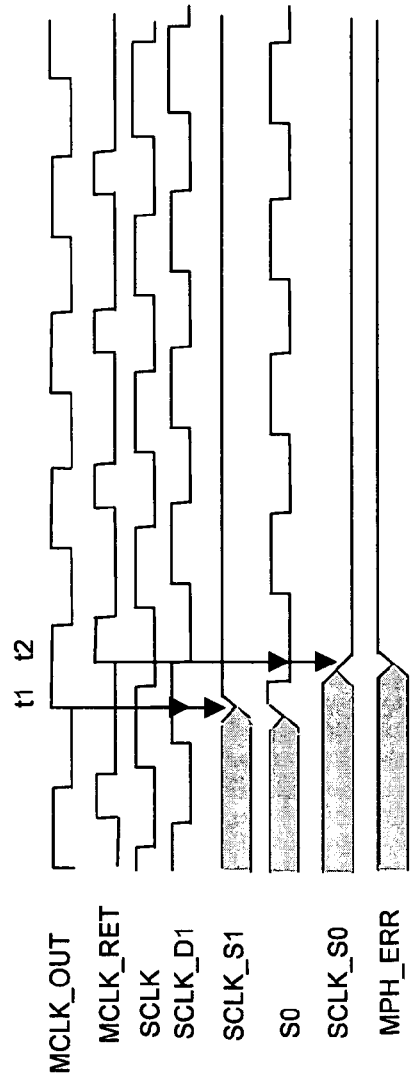
FIG. 6D illustrates exemplary phase relationships between the MCLK and SCLK signals in which the MCLK signal is inverted by the alternate MCLK/SCLK phase of FIG. 5.
Figure 6C:
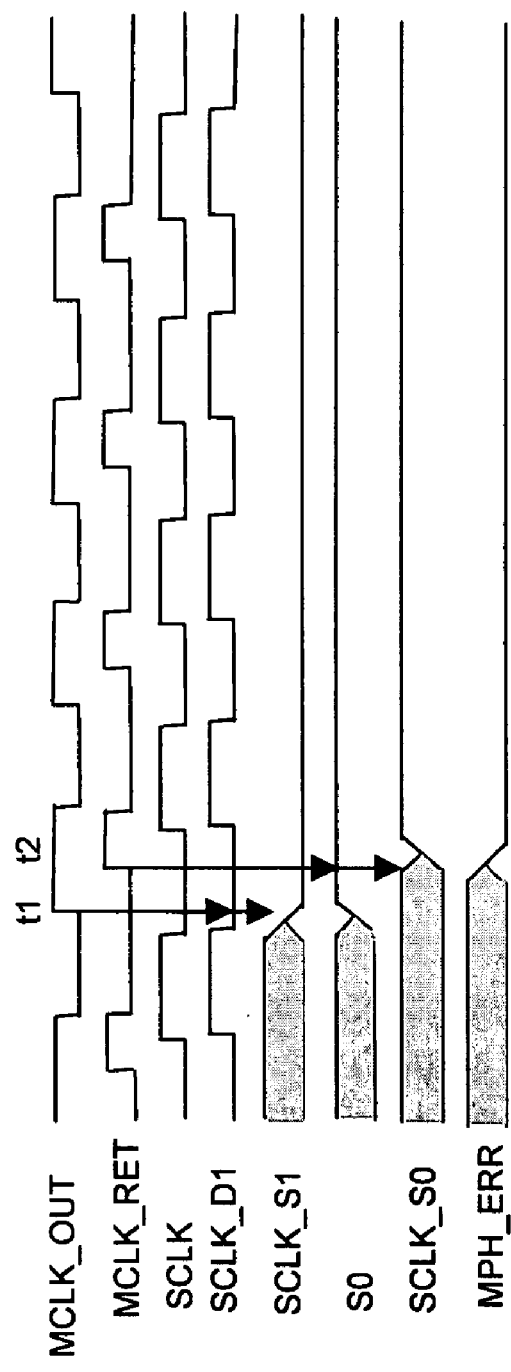

FIGS. 6A–6C illustrate exemplary phase relationships between the MCLK_OUT signal and the SCLK signal in which the true MCLK_OUT signal is selected by alternate MCLK/SCLK phase detector 500. In particular, FIG. 6A illustrates the detection of a rising edge of the SCLK signal by MCLK/SCLK phase detector 500. In this case, the rising edge of the MCLK_OUT signal samples the logic low level of the SCLK_D1 SIGNAL into first D flip-flop 502a at time t1, such that multiplexer 203 selects the B1 blocking signal. At time t2, the next rising edge of the MCLK_RET signal clocks the B1 blocking signal to the output of second D flip-flop 502b as the logic high SCLK_S0 signal. Gate 504 then outputs the MCLK_ECC signal at a logic low level, such that multiplexer 203 selects the un-inverted true MCLK_OUT signal.

FIG. 6B illustrates the detection of the high phase of the SCLK signal by MCLK/SCLK phase detector 500. In this case, the rising edge of the MCLK_OUT signal samples the logic high level of the SCLK_D1 signal into first D flip-flop 502a at time t1, such that multiplexer 203 selects the logic high phase of un-delayed SCLK signal as the S0 signal. With the next rising edge of the MCLK_RET signal, the SCLK_S0 signal at the output of second D flip-flop 502b transitions to a logic high state and the gate 504 again outputs the MCLK_ERR SIGNAL in a logic low state to select the un-inverted MCLK_OUT signal, as shown in FIG. 2.

FIG. 6C illustrates the detection of the low phase of the SCLK signal by MCLK/SCLK phase detector 500. Here, the rising edge of the MCLK_OUT signal samples the logic low level of the SCLK_D1 signal into first D flip-flop 502a at time t1, and the SCLK_S1 SIGNAL correspondingly transitions to a logic low state. In response, multiplexer 203 selects the B1 blocking signal and the s0 signal transitions to a logic high state. On the next rising edge of the MCLK_RET, at time t2, signal, the SCLK_S0 SIGNAL transitions to a logic high state such that gate 504 outputs the MCLK_ERR SIGNAL in a logic low state to select the un-inverted MCLK_OUT signal, as shown in FIG. 2.

FIG. 6D illustrates exemplary phase relationships between the MCLK_OUT signal and the SCLK signal in which the MCLK_INV signal is selected by MCLK/SCLK phase detector 500 of FIG. 5 and multiplexer 203 of FIG. 2. Specifically, FIG. 6D depicts the detection of the falling edges of the SCLK signal. The rising edge of the MCLK signal samples the logic high level of the SCLK_D1 SIGNAL into first D flip-flop 502a at time t1, such that the 50 signal initially transitions to a logic high state. Initially, the s0 signal then transitions low, as it tracks the phases of the SCLK signal. At time t2, the next rising edge of the MCLK_RET signal clocks the logic low state of the s0 signal to the output of second D flip-flop 502b as the logic low SCLK_S0 SIGNAL. Gate 504 then outputs the MCLK_ECC SIGNAL at a logic high level, such that multiplexer 203 selects the MCLK_INV signal as the MCLK_OUT signal.

Figure 7:
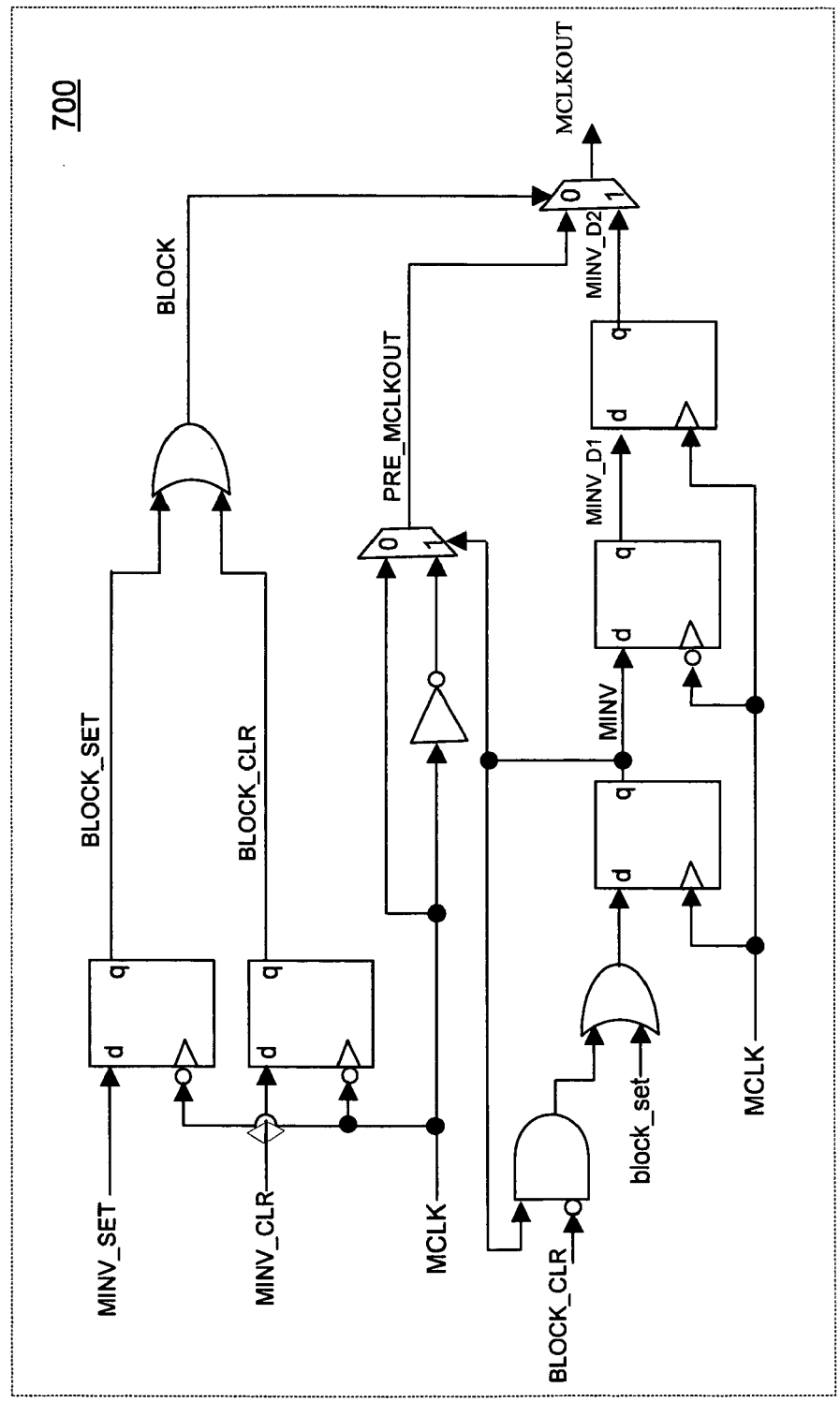
FIG. 7 is a block diagram of exemplary MCLK selection circuitry suitable for utilization in the clock phase inverter circuit of FIG. 2.
Figure 8:
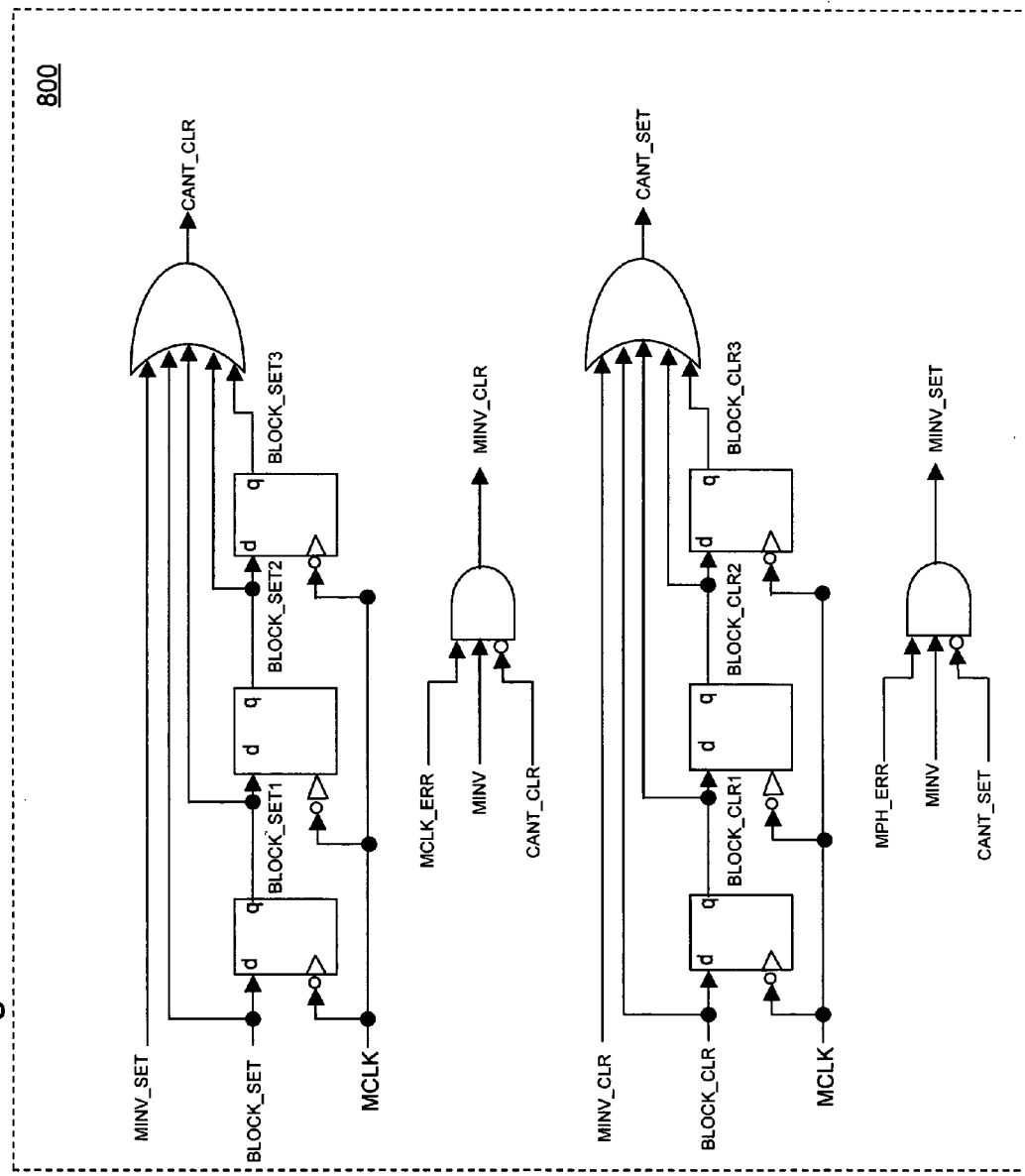
FIG. 8 is a block diagram of representative control signal blocking circuitry suitable for utilization in the clock phase inverter circuit of FIG. 2.
Figure 9:
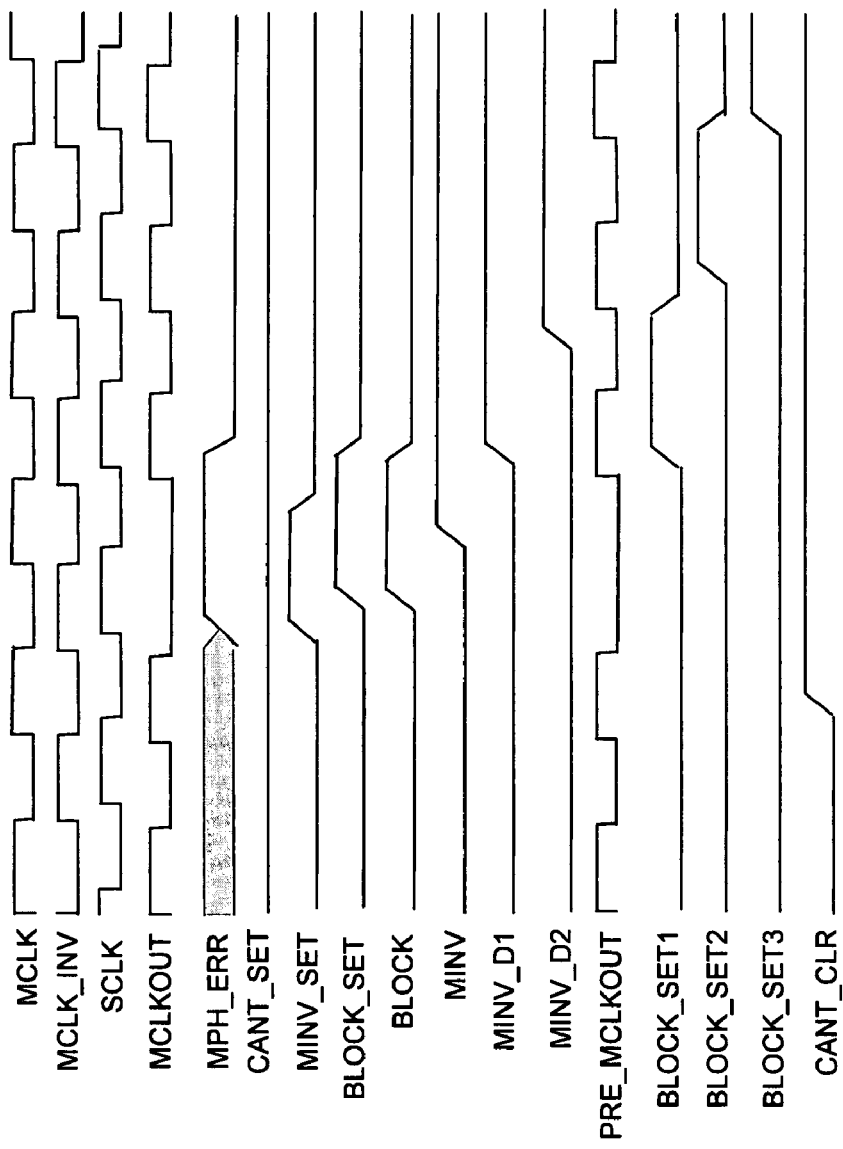
FIG. 9 is a timing diagram illustrating the operation of the MCLK selection circuit of FIG. 7 and the control signal blocking circuitry of FIG. 8.

FIG. 7 is a block diagram of exemplary MCLK selection circuitry 700, suitable for utilization in multiplexer 203 of FIG. 2, and FIG. 8 is a block diagram of control signal blocking circuitry 800, suitable for utilization in associated MCLK/SCLK phase detector 202. The operation of MCLK selection circuitry 700 and control signal blocking circuitry 800 is described by the corresponding signals depicted in the timing diagram of FIG. 9.

MCLK selection circuitry 700 ensures that when multiplexer 203 of FIG. 2 switches between the MCLK and MCLK_INV SIGNALS, such that glitches do not appear at the multiplexer 203 output. In particular, MCLK selection circuitry 700 temporarily blocks the output of multiplexer 203 while the MCLK_ECC MULTIPLEXER selection signal of FIG. 5 and FIGS. 6A–6D is changing state. Control signal blocking circuitry 800 blocks selected control signals during switching of multiplexer 203, to eliminate control oscillation, which may occur in embodiments in which the MCLK_OUT SIGNAL is feedback to MCLK/SCLK phase detector 202 as the new MCLK signal.

Although the invention has been described with reference to specific embodiments, these descriptions are not meant to be construed in a limiting sense. Various modifications of the disclosed embodiments, as well as alternative embodiments of the invention, will become apparent to persons skilled in the art upon reference to the description of the invention. It should be appreciated by those skilled in the art that the conception and the specific embodiment disclosed might be readily utilized as a basis for modifying or designing other structures for carrying out the same purposes of the present invention. It should also be realized by those skilled in the art that such equivalent constructions do not depart from the spirit and scope of the invention as set forth in the appended claims.

It is therefore contemplated that the claims will cover any such modifications or embodiments that fall within the true scope of the invention.

What is claimed is:

1. An integrated circuit comprising:
   sampling circuitry for sampling input data at an input port of the integrated circuit in response to active edges of a first clock signal;

driver circuitry for outputting output data from an output of the integrated circuit in response to active edges of a second clock signal, wherein the second clock signal is independent of the first clock signal in frequency and phase; and clock signal control circuitry comprising:
  a selector for selecting between a first clock signal and an inverse of the first clock signal; and
  a phase detector for determining a phase relationship between the first clock signal and the second clock signal, and in response causing the selector to select between the first clock signal and the inverse of the first clock signal to ensure that the active edges of the first clock signal are separated in time from the active edges of the second clock signal such that noise coupling between the driver circuitry and the sampling circuitry is minimized.

2. The clock signal control circuitry of claim 1, wherein the first clock signal comprises an audio master clock signal and the second clock signal comprises an audio serial clock signal.

3. The clock signal control circuitry of claim 1, wherein the phase detector:
  causes the selector to select the first clock signal when the second clock signal has phase difference with the first clock signal within a window defined about a nominal phase difference of one hundred and eighty degrees; and
  causes the selector to select the inverse of the first clock signal when the second clock signal has a phase difference with the first clock signal within a window defined about a nominal phase difference of zero degrees.

4. The clock signal control circuitry of claim 1, wherein the phase detector:
  causes the selector to select the first clock signal when a selected one of a rising edge and a high logic level of the second clock signal is detected; and
  causes the selector to select the inverse of the first clock signal when a selected one of a falling edge and a logic low level of the second clock signal is detected.

5. The clock signal control circuitry of claim 1, wherein the phase detector comprises:
  a delay for generating a delayed second clock signal, a delay introduced by the delay selecting a phase detection window;
  first sampling circuitry for sampling the second clock signal with the first clock signal; and
  second sampling circuitry for sampling the delayed second clock signal with the first clock signal, wherein outputs from the first and second sampling circuitry control the selection performed by the selector.

6. The clock signal control circuitry of claim 1, wherein the phase detector comprises:
  a delay for generating a delayed second clock signal;
  first sampling circuitry for sampling the delayed second clock signal with the first clock signal;
  a second selector for selecting in response to an output of the first sampling circuitry between the second clock signal and a blocking signal;
  second sampling circuitry for sampling an output of the selector in response to a third clock signal; and
  output circuitry for generating in response to the output of the first sampling circuitry and an output of the second sampling circuitry a control signal for controlling the selector.

7. The clock signal control circuitry of claim 1, wherein the first clock signal is fed-back from an output of the selector.

8. A method of clock control for minimizing noise in an integrated circuit comprising:
  sampling an input signal at an input port of the integrated circuit on active edges of a first clock signal;
  outputting data from an output port of the integrated circuit on active edges of a second clock signal, wherein the first and second clock signals are independent in frequency and phase;
  determining a phase relationship between the first clock signal and the second clock signal; and
  selecting between the first clock signal and an inverse of the first clock signal in response to the phase relationship between the first clock signal and the second clock signal to ensure that the active edges of the first clock signal are separated in time from the active edges of the second clock signal such that noise coupling between the input and output ports is minimized.

9. The method of claim 8, wherein the first clock signal is an audio master clock signal and the second clock signal is an audio serial clock signal.

10. The method of claim 8, wherein selecting comprises:
  selecting the first clock signal when the second clock signal has phase difference with the first clock signal within a window defined about a nominal phase difference of one hundred and eighty degrees; and
  selecting the inverse of the first clock signal when the second clock signal has a phase difference with the first clock signal within a window defined about a nominal phase difference of zero degrees.

11. The method of claim 8, wherein selecting comprises:
  selecting the first clock signal when a selected one of a rising edge and a high logic level of the second clock signal is detected; and
  selecting the inverse of the first clock signal when a selected one of a falling edge and a logic low level of the second clock signal is detected.

12. The method of claim 8, wherein determining a phase difference comprises:
  sampling the second clock signal;
  delaying second signal by a delay defining a phase detection window; and
  sampling the delayed second clock signal with the first clock signal, wherein logic levels the sampled second clock signal and the sampled delayed clock signal represent phase differences inside and outside of the phase detection window.

13. The method of claim 8, wherein selecting comprises:
  selecting the first clock signal when a selected one of a rising edge and a high logic level of the second clock signal is detected; and
  selecting the inverse of the first clock signal when a selected one of a falling edge and a logic low level of the second clock signal is detected.

14. The method of claim 8, further comprising feeding-back the selected one of the first signal and the inverted first signal for determining the phase difference.

15. The method of claim 8, wherein determining a phase relationship comprises:
  delaying the second clock signal;
  sampling the delayed second clock signal with the first clock signal;
  selecting in response to a logic level of the sampled delayed second clock signal between the second clock signal and a blocking signal;

sampling the selected one of the second clock signal and the blocking signal in response to a third clock signal; and generating in response to a logic level of the sampled selected one of the second clock signal and the blocking signal and the logic level of the sampled delayed second clock signal an output signal representative of the phase relationship between the first and second clock signals.

16. An analog to digital converter comprising:

analog circuitry for sampling an input signal with a clock signal;

an output driver for outputting digital data with another clock signal; wherein the clock signal and the another clock signal are independent in frequency and phase; and clock control circuitry for selectively inverting the clock signal to the analog circuitry to reduce noise coupling to the analog circuitry from the output driver comprising:

a selector for selecting between the clock signal and an inverse of the clock signal; and a phase detector for determining a phase relationship between the clock signal and the another clock signal and in response controlling the selection by the selector between the clock signal and the inverse of clock signal to minimize sampling of noise generated by the output driver by the analog circuitry by ensuring that active edges of the clock signal and active edges of the another clock signal are spaced in time.

17. The analog to digital converter of claim 16, wherein the input signal comprises a stream of analog audio and the another clock comprises a serial audio clock.

18. The analog to digital converter of claim 17, wherein the analog to digital converter is operating in a slave mode and the serial clock signal is received from an external source.

19. The analog to digital converter of claim 16, wherein the clock signal comprises an internally generated clock signal.

20. The analog to digital converter of claim 16, wherein the clock signal comprises a clock signal received from an external source.

* * * * *